United States Patent [19]

Nakagawa

[11] Patent Number: 4,926,372

[45] Date of Patent: May 15, 1990

[54] MEMORY CARTRIDGE BANK SELECTING
[75] Inventor: Katsuya Nakagawa, Kyoto, Japan
[73] Assignee: Nintendo Company Limited, Kyoto, Japan
[21] Appl. No.: 47,039
[22] Filed: May 5, 1987
[30] Foreign Application Priority Data May 6, 1986 [JP] Japan ............................. 61-104175

[51] Int. Cl.$^5$ .................... G06F 12/06; G06F 15/44
[52] U.S. Cl. ............................. 364/900; 364/929.2; 364/957; 364/957.1; 364/957.2; 364/954; 364/966.4
[58] Field of Search ... 364/200 MS File, 900 MS File, 364/707, 709

[56] References Cited

U.S. PATENT DOCUMENTS

| | | | |
|---|---|---|---|
| 3,737,860 | 6/1973 | Sporer | 364/200 |
| 4,095,791 | 6/1978 | Smith | 273/75 G |
| 4,118,773 | 10/1978 | Raguin et al. | 364/200 |
| 4,120,030 | 10/1978 | Johnstone | 364/200 |
| 4,149,027 | 4/1979 | Asher | 174/52.1 |
| 4,153,937 | 5/1979 | Poland | 364/200 X |
| 4,218,582 | 8/1980 | Hellman | 380/30 |
| 4,352,492 | 10/1982 | Smith | 273/1 GC |
| 4,368,515 | 1/1983 | Nielsen | 364/200 |
| 4,374,417 | 2/1983 | Bradley et al. | 364/200 |
| 4,383,296 | 5/1983 | Sander | 364/200 |
| 4,384,326 | 5/1983 | Devchoudhury | 364/200 |
| 4,432,067 | 2/1984 | Nielsen | 364/900 |
| 4,442,486 | 4/1984 | Mayer | 364/200 |
| 4,446,519 | 5/1984 | Thomas | 364/300 |
| 4,454,594 | 6/1984 | Heffron et al. | 364/900 |
| 4,458,315 | 7/1984 | Uchenick | 380/4 |
| 4,462,076 | 7/1984 | Smith, III | 364/200 |
| 4,471,163 | 9/1984 | Donald | 364/200 X |
| 4,481,570 | 11/1984 | Wiker | 364/200 |
| 4,485,457 | 11/1984 | Balaska et al. | 364/900 |
| 4,492,582 | 1/1985 | Chang | 178/85 X |
| 4,500,879 | 2/1985 | Smith, III et al. | 340/739 |
| 4,503,491 | 3/1985 | Lushtak et al. | 364/200 |
| 4,562,306 | 12/1985 | Chou | 380/4 |
| 4,575,522 | 3/1986 | Pellegrini | 523/220 |
| 4,575,621 | 3/1986 | Dreifus | 235/380 |
| 4,613,953 | 9/1986 | Bush et al. | 364/900 |
| 4,644,495 | 2/1987 | Crane | 364/900 |
| 4,713,759 | 12/1987 | Yamagishi et al. | 364/200 |
| 4,725,945 | 2/1988 | Kronstadt et al. | |
| 4,757,468 | 7/1988 | Domenik | 364/900 |

FOREIGN PATENT DOCUMENTS 0057815 8/1982 European Pat. Off. .
0114522 1/1984 European Pat. Off. .

OTHER PUBLICATIONS

Wescon Conference Record, vol. 24, 16th-18th Sep. 1980, pp. 1-4, Anaheim, CA, U.S.; K. M. Guttag: "The TMS 9918, video display processor for personal computers".
Electronics Engineering, vol. 58, NO. 711, Mar. 1986, pp. 131-134, London, GB; K., Robinson: "Overcoming addressing limitations with page-addressed EPROMs".
E.D.N. Electrical Design News, vol. 30, No. 20, 5th Sep. 1985, pp. 303-304, Newton, Mass., U.S.; J. Hardway: "146805 muP addresses an extra 10 k bytes".
Elektronic, vol. 31, No. 6, Mar. 1982, pp. 55-56, Munchen, DE; R. Schone: "Addressenextensor fur 8-bit-muP".
IEEE Trans. on Cons. Electr., vol. CE-25, No. 5, Nov. 1979, pp. 741-753, IEEE, New York, U.S.; K. Li: "Universal video interface".

*Primary Examiner*—Gareth D. Shaw
*Assistant Examiner*—P. V. Kulik
*Attorney, Agent, or Firm*—Nixon & Vanderhye

[57] ABSTRACT

A memory cartridge is loaded in a main unit of a personal computer when used. The memory cartridge comprises a case, and a printed circuit board which is installed therein and on which a large-capacity, one-chip ROM is mounted. Storage area of the one-chip ROM is divided into a plurality of banks respectively having memory addresses of a number accessible by a central processing unit of the main unit, and one specific bank among them is allocated to an address space accessible all the time by the central processing unit. Bank selecting data for selecting other banks is stored in that specific bank. The bank selecting data is read out with progress of a program stored in the specific bank, being loaded in a counter. The content of the counter is inputted to the most significant three bits of address of the one-chip ROM. The most significant three bits of the address function as bank designating bits. An arbitrary bank of the one-chip ROM is changed over at an arbitrary timing by the bank selecting data outputted from the other banks of the one-chip ROM.

4 Claims, 4 Drawing Sheets

MEMORY CARTRIDGE BANK SELECTING

BACKGROUND OF THE INVENTION

1. Field of the Invention

The present invention relates to a memory cartridge. More specifically, the present invention relates to a memory cartridge which is attachable to and detachable from a main unit of a personal computer such as a home video gaming machine and is loaded in the main unit when used.

2. Description of the Prior Art

Home personal computers include the gaming machine called the "Nintendo Entertainment System" (trade mark) manufactured and sold by the applicant of the present invention and the one called the "MSX" (commodity name). In these personal computers, an external memory cartridge in which a program of game, education or the like is written in advance is used, and the personal computer is enabled by loading such external memory cartridge in the main unit. The memory cartridge includes a non-volatile memory (for example, ROM) for storing program data and/or character data for display.

When a central processing unit (CPU) comprised in the main unit of the personal computer accesses to the ROM of the memory cartridge, the maximum number of accessible addresses, that is, address space is limited by the performance (number of bits) of the central processing unit, and therefore the usable memory capacity of the ROM comprised in the memory cartridge is also limited naturally. For example, in the above-described "Nintendo Entertainment System", only a 256K-bit ROM can be used for program and a 64K-bit ROM for characters at a maximum. Thus, the maximum number of program steps is limited to the maximum address space accessible by the central processing unit, and therefore when such a personal computer is used as a gaming machine, for example, the length of story of the game, the extension of variation in the game, the number of display scenes and the number of characters capable of being displayed are limited.

One prior art was proposed to eliminate such an inconvenience. This is, for example, the Japanese Patent Laid-Open No. 112352/1984, laid open on June 28, 1984, which corresponds to the U.S. patent application Ser. No. 261,301, now U.S. Pat. No. 4,368,515.

In the above-described prior art, an address from the central processing unit installed in the main unit of the gaming machine is given to a plurality of memory chips as a common address input, while that address is decoded by an address decoder. When a specific address is outputted by the central processing unit, the address decoder outputs a signal, and in response to the signal, a flip-flop or a latching circuit is operated. From the flip-flop or the latching circuit, a chip select (CS) signal for selecting one corresponding to that specific address is outputted, and the chip select signal enables the corresponding memory chip. Accordingly, the memory area designated by the address of the selected memory chip can be accessed by the central processing unit.

The above-described prior art has an advantage that the memory capacity can be expanded without increasing the address ports from the central processing unit, but leaves the following problem to solve.

With the recent advance in the semiconductor technology, the degree of integration of integrated circuit chip is being more and more increased, but the above-described prior art cannot accommodate for such a one-chip, large-capacity memory. Because, output of the flip-flop or the latching circuit is used as a chip select signal, and such a chip select signal can only select enabling or disabling on a chip basis, and cannot perform enable/disable of the specific area in the one-chip memory. In other words, in the prior art, an arbitrary chip of the memory chips respectively having the number of addresses accessible by the central processing unit can be enabled to designate an address, but banks respectively having addresses accessible by the central processing unit of a one-chip memory having addresses of a number larger than the address space accessible by the central processing unit cannot be selected or addressed. Accordingly, by the prior art, the benefit of the up-to-date semiconductor technology cannot be given, and the ratio of the rise in cost to the increase in memory capacity is large, eventually resulting in a high price.

In addition, various other methods of changing over the memory banks have been proposed, but any of them does not relate to the memory cartridge intended by the present invention, and accordingly has no relation to the present invention.

SUMMARY OF THE INVENTION

Therefore, a principal object of the present invention is to provide a memory cartridge which, even if the maximum address space accessible by a central processing unit comprised in a main unit of a personal computer to which the same is loaded is limited, can store data more than the address space and is accessible by the central processing unit.

Another object of the present invention is to provide a memory cartridge in which each address of a large-capacity, one-chip memory can be accessed by the central processing unit without increasing the number of address ports of the central processing unit.

The memory cartridge in accordance with the present invention is attachable to and detachable from the main unit of the personal computer including the central processing unit accessible to a relatively small address space, and is loaded in the main unit when used, comprising: a case, a circuit board housed in the case, a first memory which is mounted on the board and has a relatively large memory capacity and whose memory area is divided into a plurality of banks, an active device which is mounted on the board and is for selectively designating a bank of the first memory, and conductive patterns for leading address terminals and data terminals of the first memory to the edge of the board to enable them to connect to the central processing unit of the main unit and connecting the first memory and the active device.

When the central processing unit accesses to a predetermined bank of the first memory, data stored in the bank is read out. If the data includes data showing a bank of the first memory to be accessed next, the active device enables that bank of the first memory based on that data, for example. The central processing unit accesses to that bank using another address space.

If the memory cartridge includes a second memory, data read from the bank of the first memory is transferred to the second memory as required. When memory cartridge is used for the gaming machine, character data is stored in the second memory.

In accordance with the present invention, even if the address space accessible by the central processing unit is limited, by properly changing-over banks of the first memory, a memory having capacity larger than the maximum address space of the central processing unit can be utilized. This means that, in accordance with the present invention, the memory capacity accessible by the central processing unit can be expanded apparently.

In an embodiment, a large-capacity, one-chip ROM is used as the first memory. A specific bank of the one-chip ROM is kept accessible all the time by the central processing unit. When the specific bank is accessed and a bank selecting data for selecting another bank is read therefrom, the bank selecting data is given to a counter as an active device. Output of the counter is given to the most significant three bits of the address of the one-chip ROM, and thereby another bank in the one-chip ROM is enabled. The bank thus enabled can be addressed by the output from the address port of the central processing unit.

Selecting data for still another bank is stored in the previously enabled bank, and when the same is read out, the counter outputs an address which is to enable that still another bank to the most significant three bits of the address of the one-chip ROM in a similar manner.

Thus, in accordance with the embodiment of the present invention, change-over to an arbitrary bank can be made at an arbitrary timing with the progress of a program. Accordingly, by utilizing the memory cartridge as described above for a cartridge for gaming machine, a more versatile game can be realized. In this case, the character data stored in the bank of the one-chip ROM can be utilized in common in each scene of displaying performed by each bank of the one-chip ROM, and therefore a series of games having long stories can also be produced easily.

Also, in accordance with the present invention, an unjust copying or dubbing of the memory cartridge can be prevented by arbitrarily setting the bank selecting data at an arbitrary program step.

These objects and other objects, features, aspects and advantages of the present invention will become more apparent from the following detailed description of the embodiments of the present invention when taken in conjunction with accompanying drawing.

DESCRIPTION OF THE PREFERRED EMBODIMENTS

Figure 1:
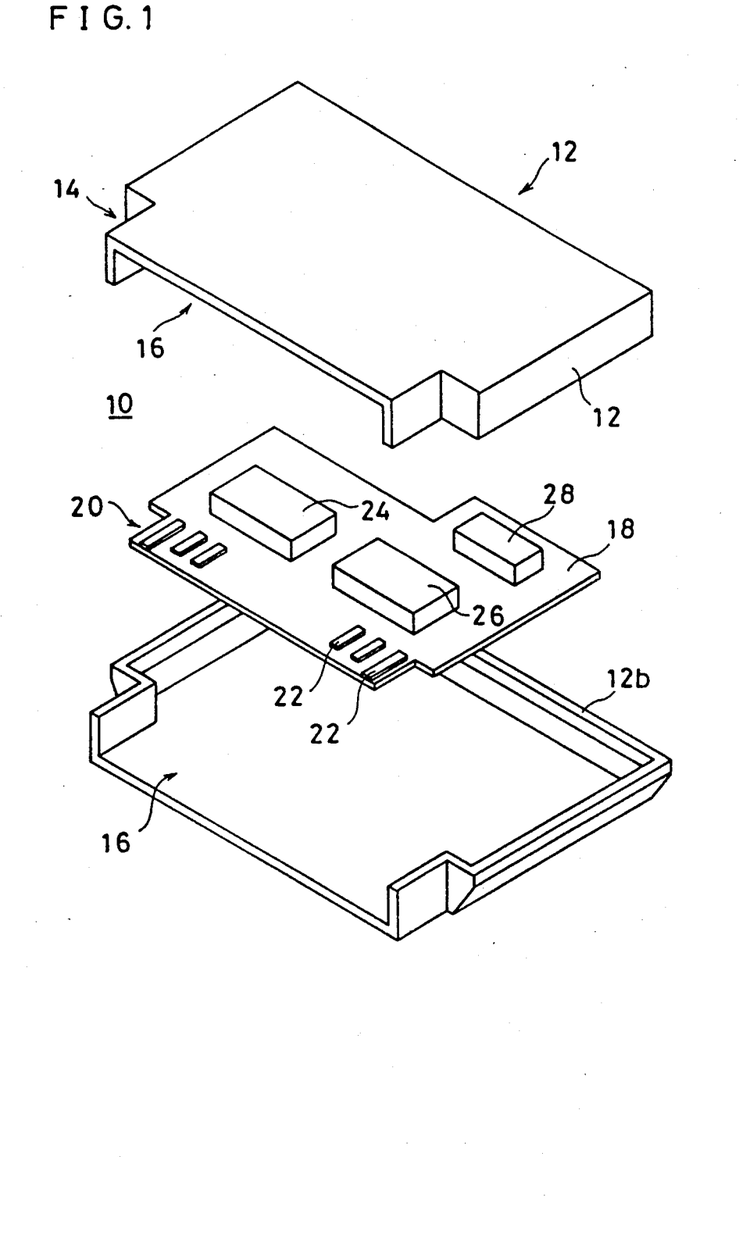
FIG. 1 an exploded perspective view showing one embodiment in accordance with the present invention.

FIG. 1 is an exploded perspective view showing one embodiment in accordance with the present invention. A memory cartridge for gaming machine (hereinafter referred to simply as cartridge) 10 comprises a case 12 formed by an upper case 12a and a lower case 12b. The case 12 is flat and nearly rectangular, and a protrudent portion 14 is formed at one side thereof. Then, an opening 16 is formed by this protrudent portion 14 and the other sides of the case 12 are sealed by side walls.

A printed circuit board 18 is housed in the case 12, and a protrudent portion 20 is formed at a portion of the printed circuit board 18 corresponding to the protrudent portion 14 of the above-described case 12. Accordingly, the protrudent portion 20 of the printed circuit board 18 is exposed through the opening 16 of the case 12. Then, conductive patterns or contacts 22, 22, constituting means for connecting the cartridge 10 to a main unit of a gaming machine are formed on the protrudent portion 20 in a manner of distributing in the extending direction of the side of the protrudent portion 20.

A program memory 24 as a first memory, a character memory 26 as a second memory and a semiconductor device 28 as an active device are mounted on the printed circuit board 18. As detailed later, the semiconductor device 28 may be a counter or a latching circuit. Then, these devices 24, 26 and 28 are connected to proper conductive patterns on the printed circuit board 18, being connected to predetermined contacts 22 formed on the protrudent portion 20 as required.

Figure 2:
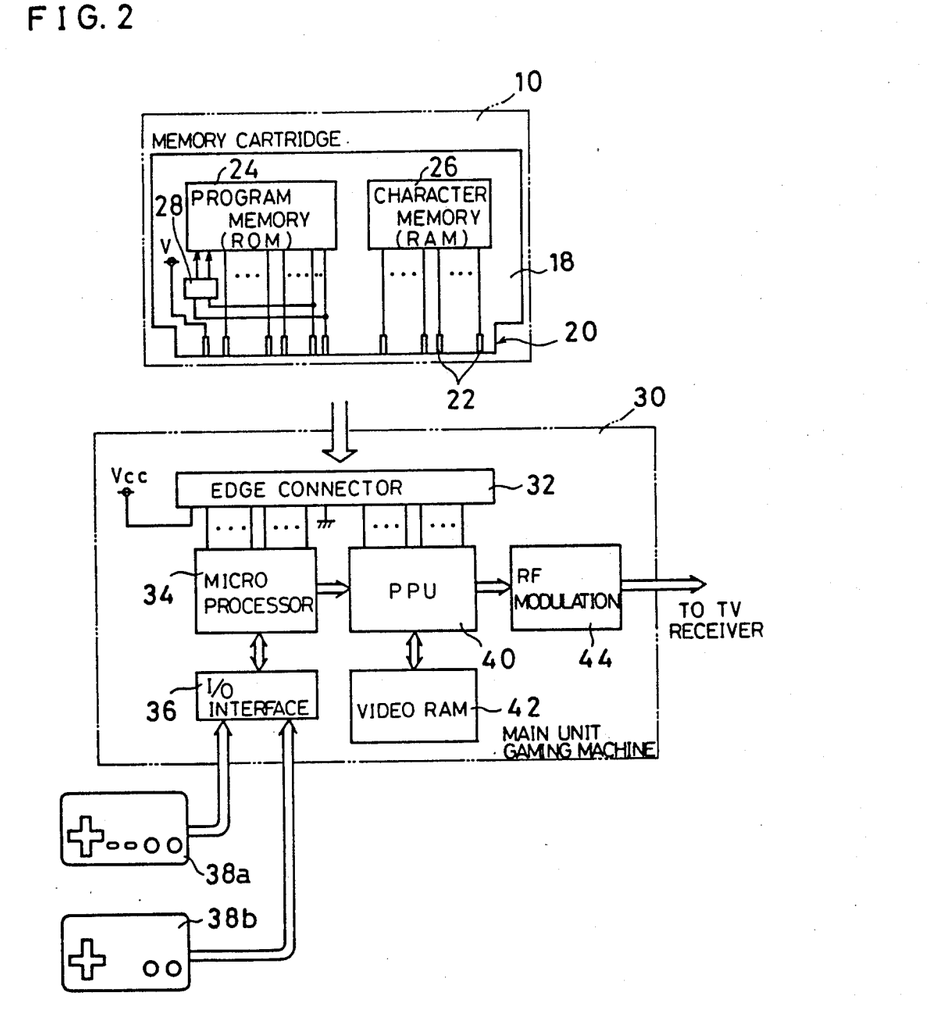
FIG. 2 is a schematic block diagram showing one example of a home TV gaming machine capable of utilizing a cartridge as shown in FIG. 1.

FIG. 2 is a schematic block diagram showing one example of a home TV gaming machine capable of utilizing the cartridge as shown in FIG. 1. A configuration in this FIG. 2 shows the above-described "Nintendo Entertainment System" manufactured and sold by the applicant of the present invention. However, it is pointed out in advance that the present invention can be utilized for every apparatus such as the gaming apparatus or the microcomputer using an external memory cartridge.

As described above, the cartridge 10 comprises the program memory 24, the character memory 26 and the semiconductor device 28 which are mounted on the printed circuit board 18, and the protrudent portion 20 of the printed circuit board 18 is attached to an edge connector 32 of a gaming machine main unit 30, and thereby the cartridge 10 and the gaming machine main unit 30 are connected electrically so as to constitute one gaming system.

The gaming machine main unit 30 comprises a microprocessor 34 which may be, for example, the integrated circuit "2A03" manufactured by Nintendo, and controllers 38a and 38b are connected to the microprocessor 34 through an I/O interface 36. The gaming machine main unit 30 is further provided with a PPU (picture processing unit) 40, a video RAM 42 and an RF modulator 44. For the PPU 40, for example, the integrated circuit "2C02" manufactured by Nintendo is used, and the PPU 40 reads video data under the control of the microprocessor 34, and gives the same to the RF modulator 44 as a video signal. The RF modulator 44 outputs a video signal being given as a television signal for a TV receiver, for example, of the NTSC system.

Figure 3:
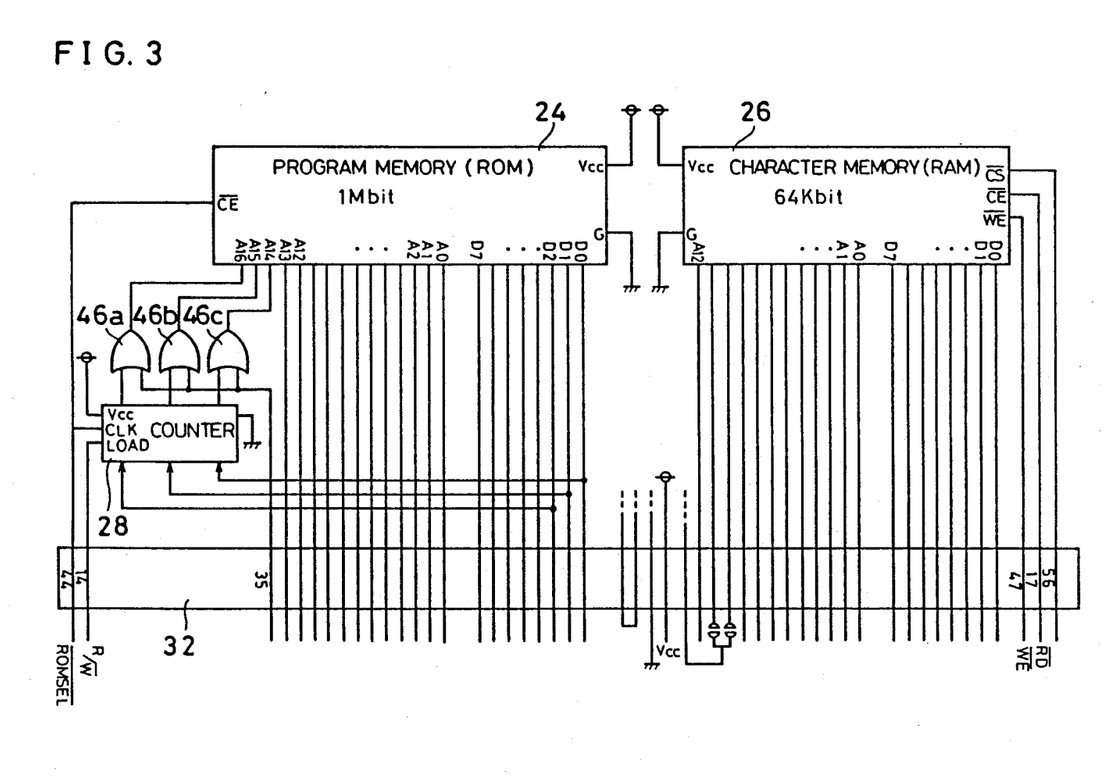
FIG. 3 is a detailed circuit diagram showing a relationship between a memory for program and a memory for characters as shown in FIG. 1 and FIG. 2.

Here, detailed description is made on correlation among the program memory 24, the character memory 26 and the semiconductor device 28 in reference to FIG. 3. For example, the program memory 24 is composed of a 1M-bit masked ROM, and the character memory 26 is composed of a 64K-bit static RAM. Ground terminals G of the program memory 24 and the character memory 26 are connected to the ground, and a predetermined power supply voltage Vcc is applied to these memories 24 and 26 through power supply terminals.

A chip enable terminal CE of the program memory 24 is connected to the gaming machine main unit 30

(FIG. 2) through a predetermined terminal (for example, No. 44 terminal) of the edge connector 32. A memory select signal ROMSEL from the gaming machine main unit 30 is given to the chip enable terminal CE. Furthermore, the program memory 24 has address terminals A0–A16 of 17 bits, and has data terminals D0–D7 of 8 bits. These address terminals and data terminals are connected to the gaming machine main unit 30 through the edge connector 32, and data from predetermined terminals, that is, data from the terminals D0–D2 of the least significant three bits in this embodiment, is given as bank selecting data and as three-bit input of the semiconductor device, that is, the counter 28.

A chip select terminal CS, the chip enable terminal CE and a write enable terminal WE of the character memory 26 are all connected to the gaming matching main unit 30 through the terminals of the edge connector 32 (for example, No. 56 terminal, No. 17 terminal and No. 47 terminal). A read signal RD from the gaming machine main unit 30 is given to the chip enable terminal CE through the edge connector 32, and the write signal WE is given to the write enable terminal WE. Also, the character memory 26 comprises address terminals A0–A12 of 13 bits and data terminals D0–D7 of 8 bits. The address terminals A0–A12 are connected to the gaming machine main unit 30 through the edge connector 32. The data terminals D0–D7 are connected likewise to the gaming machine main unit 30.

Note that one digit of address is indicated by the hexadecimal notation.

Figure 4:
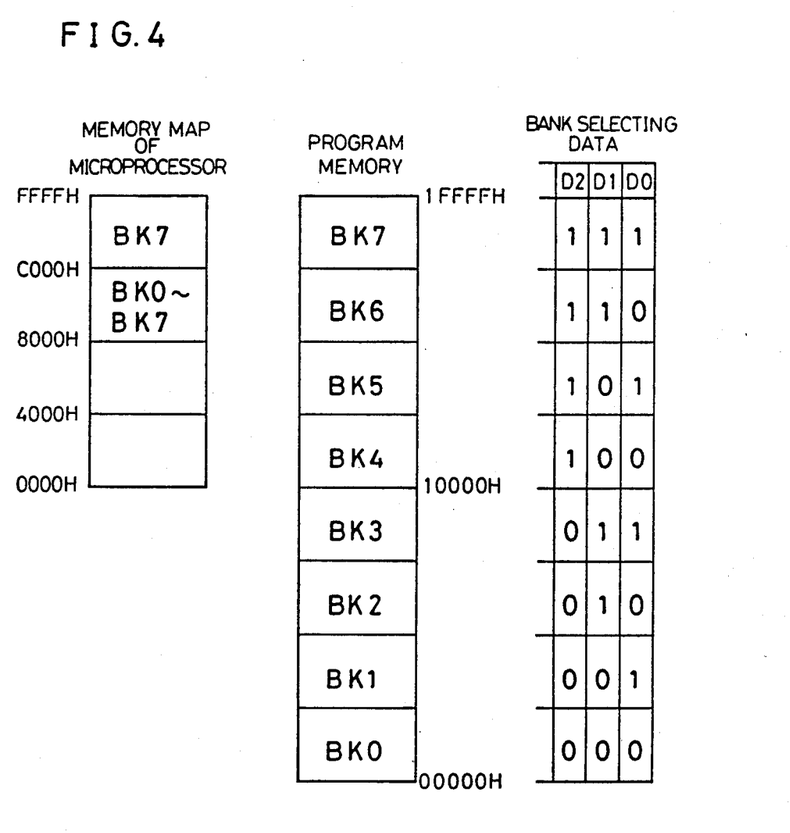
FIG. 4 is an illustrative view showing a relationship between banks of the memory for program and a memory map of a microprocessor.

In this embodiment, as shown in FIG. 4, the program memory 24 is constituted, for example, as a set of memory banks on a 128K-bit basis. This means that the first memory or the program memory 24 comprises eight 128K-bit banks BK0–BK7. These banks BK0–BK7 are defined by addresses "00000-1FFFF".

Also, the second memory or the character memory 26 is constituted as a 64K-bit static RAM.

Furthermore, in this embodiment, for the semiconductor device 28, for example, the integrated circuit "74LS161" manufactured by Texas Instruments is used, and accordingly the semiconductor device 28 is constituted as a three-bit counter. A read/write signal R/W from the gaming machine main unit 30 is given to a load terminal LOAD of the counter 28, and as described above, the data terminals D0–D2 of the least significant three bits of the program memory 24 are connected to the load terminal LOAD as a preset input. Furthermore, the memory select signal ROMSEL from the gaming machine main unit 30 to the program memory 24 is given to a clock terminal CK through the edge connector 32. Accordingly, count input is given to the counter 28 every time when the program memory 24 is selected by the gaming machine main unit 30, and the counter 28 is incremented (or decremented) by that count input.

Output terminals of the counter 28 is of three bits, and the three-bit output is given to the address terminals of the most significant three bits A16, A15 and A14 of the program memory 24 through respective OR gates 46a, 46b and 46c. More specifically, the address terminal (No. 35 terminal) of the gaming machine main unit 30 is connected to one input of each of these OR gates 46a, 46b and 46c, and each output of the corresponding bit of the counter 28 is given to the other input of each OR gate. Accordingly, for the program memory 24, the bank thereof is selected according to the bank selecting data (FIG. 4) in the output of the counter 28. For example, as shown in FIG. 4, if the output of the counter 28 is "000", the bank BK0 is selected, if "001" the bank BK1 is selected, if "010" the bank BK2 is selected, if "011" the bank BK3 is selected, if "100" the bank BK4 is selected, if "101" the bank BK5 is selected, if "110" the bank BK6 is selected, and if "111" the bank BK7 is selected, respectively.

The microprocessor 34 of the gaming machine main unit 30 is accessible only to two-bank area of the program memory 24 as the first memory. This means that the microprocessor 34 has address spaces for two banks, "8000-FFFF". Among them, a first address space "C000-FFFF" is allocates so as to access in a fixed fashion always to the bank BK7 of the program memory 24. Then, when an arbitrary bank of the banks BK0-BK7 of the program memory 24 is selected, a second address space of 64K bits defined by addresses "8000-C000" is allocated to the address space corresponding to the selected bank.

Accordingly, in the banks BK0-BK7 of the first memory 24, the bank selecting data for the bank to be selected next is required to be stored in the last of or halfway that data. To be detailed, in the bank BK7 as a standing area, the data of the bank to be accessed next by the central processing unit or the microprocessor 34 is stored, and in the bank to be read next in such a manner, the selecting data for the still next bank is stored. Then, all the banks of the program memory 24 can be utilized at an arbitrary timing by the second address space of the microprocessor 34.

In the operation, the power supply is first turned on in the state that the cartridge 10 is loaded in the gaming machine main unit 30, and immediately after that or after a reset switch has been depressed, a read command is outputted from the microprocessor 34 of the gaming machine main unit 30 through the address terminal A14 thereof (No. 35 terminal of the edge connector 32). When the address terminal A14 goes high, all outputs of the OR gates 46a–46c become high, and "1" is inputted to all of the address terminals A16–A14 of the most significant three bits of the program memory 24, and accordingly, at this point the microprocessor 34 is accessible to the standing area, that is, the bank BK7 of the program memory 24.

Then, the program data of the bank BK7 of the program memory 24 is read and the microprocessor 34 is operated based on that program data. This means that, at this time, the microprocessor 34 can address the bank BK7 using the first address space of the addresses "C000-FFFF".

The microprocessor 34 executes a program according to a program data of the bank BK7 of the program memory 24, and the bank selecting data for designating a bank of the program memory 24 is set in the first of (or in the last of or halfway) that program data. As described previously, the bank selecting data selects any one of the banks BK0-BK7 of the program memory 24 by three bits of "000"–"111".

Then, the bank selecting data from the data terminals D0–D2 of the least significant three bits of the program memory 24 is given as a preset input of the counter 28. On the other hand, the read/write signal R/W is given to the counter 28 as a load command of the counter 28 from the microprocessor 34, and at this time, the signal R/W is given as the high level, and accordingly in the counter 28, the preset input thereof is not loaded.

When the read/write signal R/W goes low level during execution of the program, that is, when the load command is given, the bank selecting data outputted from the data terminals D0-D2 of the least significant three bits of the program memory 24 is written to the counter 28. Thereafter, the microprocessor 34 gives a read signal, that is, changes the signal R/W to the high level, and accesses to the bank (for example, BK6) selected by the counter 28 using the second address space as described above.

When the memory select signal ROMSEL from the microprocessor 34 of the gaming machine main unit 30 is low level, the counter 28 and the program memory 24 are enabled. Then, if the data of the selected bank (for example, BK6) is character data, a command of transferring the character data to the second memory, that is, the character memory 26 is outputted.

Then, according to that transfer command, the write enable signal WE from the microprocessor 34 is changed to the low level, and write of the character memory 26 is made possible. Then, the data of the selected bank (for example, BK6) of the program memory 24 are all read in the address sequence, and the read character data are given to the microprocessor 34. The microprocessor 34 gives the character data to the PPU 40, and the PPU 40 writes the character data to the character memory 26 in synchronism with address designating of the character memory 26.

Thereafter, similarly, according to the bank selecting data contained in the program data from the program memory 24, any of the banks BK0-BK7 of this program memory 24 is addressed as "0000-C000" of the second address space of the microprocessor 34, and the game progresses based on the program data of the bank selected at that time and the character data of the character memory 26. Accordingly, the character data has only to be written in advance to an arbitrary bank of the program memory 24 to be required. This means that the bank selecting data is set in advance in a program data contained in any of the banks of the program memory 24, and the data of the bank selected by the bank selecting data is written into the character memory for characters 26, and thereby the bank of that character data has only to be accessed only when required. In order words, processing has only to jump to the required bank during execution of the program to read the character data at that time. Then, such a bank selecting data can be set arbitrarily by the program, and therefore copying or dubbing of the cartridge 10 can be prevented effectively.

As in the case with this embodiment, even if the maximum address space of the microprocessor 34 is relatively small, all of the banks of the program memory 24 can be selected arbitrarily, and therefore the memory capacity which can be utilized by the microprocessor 34 can be expanded apparently. In addition, the present invention can be utilized not only for the gaming system but also for the educational system, being able to have universality.

In addition, in the above-described embodiment, case is described where among a plurality of banks BK0-BK7 comprised in the program memory 24, in the bank BK7, data for transfer-controlling the character data (that is, bank selecting data, latch command of bank selecting data, write command to the character memory 26 and the like) are program-set in advance, and a return command is set in advance in the last address of the bank storing the character data, and with the progress of the game, based on the program of the bank BK7, a character data of another bank is controlled to be transferred to the character memory 26. However, the transfer-controlling data may be stored in several bites close to the last address of each bank storing the character data.

Also, in the above-described embodiment, a masked ROM is used for the program memory 24. However, for the program memory 24, for example, an EPROM or the like can be utilized, and further any type of memory can be utilized if it not volatile.

Furthermore, in the embodiment, the character data is written into the character memory 26, but for such data, besides, video data and the like can be written, and in this case, the character memory 26 can be utilized also as a so-called video RAM.

Although the present invention has been described and illustrated in detail, it is clearly understood that the same is by way of illustration and example only and is not to be taken by way of limitation, the spring and scope of the present invention being limited only by the terms of the appended claims.

What is claimed is:

1. A memory cartridge attachable and detachable from to a main unit including a computer, said main unit having a data bus, address bus, and a central processing unit, said memory cartridge comprising:
    a circuit board having address lines and data lines attachable to said address bus and said data bus, respectively, when said cartridge is attached to said main unit;
    a first memory mounted on said circuit board and connected to said address lines and said data lines, said first memory being non-volatile and having a bank selecting input terminal, said first memory having a predetermined storage capacity and being divided into a plurality of banks, each of said banks having a plurality of address locations, at least one of said banks storing bank selecting data for selecting other of said banks; and
    data holding means for holding said bank selecting data, said data holding means being mounted on said circuit board and connected to at least certain of said data lines and to said bank selecting input terminal of said first memory, said data holding means being loaded with bank selecting data read from said first memory in response to an enable signal for selecting or enabling said first memory and a write signal for writing data to said data holding means, such that said first memory is conditioned for reading data in an address being addressed by said central processing unit in a bank which is selected by said bank selecting data previously loaded into and held by said data holding means, wherein said first memory includes address terminals and said data holding means includes a semiconductor device which receives said bank selecting data from said first memory and sends a bank-switching signal to said address terminals, and wherein said semiconductor device is a counter.

2. A memory cartridge in accordance with claim 1, wherein said counter includes a gating means which, when provided with a signal produced by said central processing unit, directs this signal to the most significant of said address terminals of said first memory, and when not provided with this signal, directs an output of said holding means to the most significant of said address terminals of said first memory.

3. A memory cartridge attachable to and detachable from a data processing apparatus, said data processing apparatus having first and second data buses, first and second address buses, a central processing unit having limited addressing capability and being connected to said first data bus and said first address bus, and a video processing unit connected to said second data bus and said second address bus, said memory cartridge comprising:

a circuit board having first and second data lines attachable to said first and second data buses, respectively, and having first and second address lines attachable to said first and second address buses, respectively;

a first memory mounted on said circuit board and connected to said first data lines and said first address lines, said first memory being non-volatile and having a bank selecting input terminal, said first memory having a predetermined addressable storage capacity exceeding that of the limited addressing capability of the central processing unit, said first memory being divided into a plurality of banks, each of said banks having a memory capacity less than the address space accessible by said first address bus, at least one of said banks adapted to store program data, at least one of said address locations of one of said banks adapted to store bank selecting data for selecting another of said banks;

a second memory connected to said second data lines and said second address lines, said second memory storing character data for video processing;

data holding means mounted on said circuit board for holding said bank selecting data, said data holding means having a data input terminal connected to at least certain of said first data lines, and having an output terminal; and conductive pattern means formed on said circuit board and connecting said output terminal of said data holding means to said bank selecting input terminal of said first memory; wherein said data holding means is loaded with bank selecting data that is read from said first memory in response to an enable signal for enabling said first memory and a write signal for writing of said data holding means, and said first memory reads out data stored in an address that is addressed by said central processing unit in a bank that is selected by said bank selecting data that has been previously loaded into said data holding means, wherein said first memory includes address terminals, and said data holding means includes a semiconductor device which receives said bank selecting data from said first memory and sends a bank-switching signal to said address terminals, said semiconductor device comprises a counter means for holding said bank selecting data.

4. A memory cartridge in accordance with claim 3, wherein said counter includes a gating means which, when provided with a signal by said central processing unit, sends this signal to the most significant of said address terminals of said first memory, and when not provided with this signal, sends the output of said holding means to the most significant of said address terminals of said first memory.

* * * * *

UNITED STATES PATENT AND TRADEMARK OFFICE
CERTIFICATE OF CORRECTION

PATENT NO. : 4,926,372
DATED : May 15, 1990
INVENTOR(S) : Katsuya Nakagawa

It is certified that error appears in the above-identified patent and that said Letters Patent is hereby corrected as shown below:

Column 10, line 13, delete "of" and insert -- to --.

Signed and Sealed this

Nineteenth Day of May, 1992

Attest:

DOUGLAS B. COMER

*Attesting Officer*  *Acting Commissioner of Patents and Trademarks*